(12) United States Patent
Gaylord et al.

(10) Patent No.: US 7,906,255 B2
(45) Date of Patent: *Mar. 15, 2011

(54) PHOTO-MASKS AND METHODS OF FABRICATING PERIODIC OPTICAL STRUCTURES

(75) Inventors: Thomas K. Gaylord, Atlanta, GA (US); Justin L. Stay, Suwanee, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 320 days.

This patent is subject to a terminal disclaimer.

(21) Appl. No.: 11/970,502

(22) Filed: Jan. 7, 2008

(65) Prior Publication Data
US 2008/0174754 A1 Jul. 24, 2008

Related U.S. Application Data

(63) Continuation-in-part of application No. 11/871,834, filed on Oct. 12, 2007.

(60) Provisional application No. 60/883,557, filed on Jan. 5, 2007.

(51) Int. Cl.
*G03F 1/00* (2006.01)
*G02B 5/18* (2006.01)

(52) U.S. Cl. .......................................... 430/5; 359/566

(58) Field of Classification Search ............... 430/5, 22, 430/311, 322; 359/565–569; 355/53; 385/14, 385/37

See application file for complete search history.

(56) References Cited

U.S. PATENT DOCUMENTS

| 6,249,335 | B1 * | 6/2001 | Hirukawa et al. ............... 355/53 |
| 6,285,813 | B1 | 9/2001 | Schultz et al. |
| 6,606,432 | B2 | 8/2003 | Gaylord et al. |
| 7,085,055 | B2 * | 8/2006 | Ito et al. ........................ 359/565 |
| 2007/0092841 | A1 * | 4/2007 | Kawashima .................. 430/311 |
| 2008/0003528 | A1 * | 1/2008 | Gaylord et al. ............... 430/322 |
| 2008/0212921 | A1 | 9/2008 | Gaylord et al. |
| 2009/0098468 | A1 * | 4/2009 | Gaylord et al. ................... 430/5 |

OTHER PUBLICATIONS

Venkataraman, Sriram et al., "Fabrication of Three-Dimensional Photonic Crystals Using Silicon Micromachining", Applied Physics Letters, vol. 85, No. 11, Sep. 13, 2004, pp. 2125-2127; 1 pg. Copyright Notice.

Cai, L.Z. et al., "Formation of a Microfiber Bundle by Interference of Three Noncoplanar Beams", Optics Letters, vol. 26, No. 23, Dec. 1, 2001, pp. 1858-1860.

(Continued)

*Primary Examiner* — Stephen Rosasco
*Assistant Examiner* — Stewart A Fraser
(74) *Attorney, Agent, or Firm* — Ryan A. Schneider, Esq.; Troutman Sanders, LLP

(57) ABSTRACT

Improved photo-masks for use in fabricating periodic structures are disclosed herein. Methods of making periodic structures, as well as the periodic structures fabricated therefrom, are also disclosed. The photo-mask can include a body element and one or more sets of diffractive elements and/or refractive elements disposed on the body element or within the body element. Each set of diffractive elements and/or refractive elements can be configured to produce four noncoplanar beams of light when a beam of light is passed through it. Each set of four non-coplanar beams of light can be used to interferometrically produce a specific periodic structure at a specific location within a photosensitive recording material.

20 Claims, 3 Drawing Sheets

OTHER PUBLICATIONS

Cai, L.Z. et al., "All Fourteen Bravais Lattices Can Be Formed by Interference of Four Noncoplanar Beams", Optics Letters, vol. 27, No. 11, Jun. 1, 2002, pp. 900-902.

Cai, L.Z. et al, "Formation of Three-Dimensional Periodic Microstructures by Interference of Four Noncoplanar Beams", Optical Society of America, vol. 19, No. 11, Nov. 2002, pp. 2238-2244.

Campbell, M. et al., "Fabrication of Photonic Crystals for the Visible Spectrum by Holographic Lithography", Letters to Nature, vol. 404, Mar. 2, 2000, pp. 53-56; 1 pg. Copyright Notice.

Chelnokov, Alexei et al., "Fabrication of 2-D and 3-D Silicon Photonic Crystals by Deep Etching", IEEE Journal of Selected Topics in Quantum Electronics, vol. 8, No. 4, Jul./Aug. 2002, pp. 919-927.

Dolling, G. et al., "Negative-Index Metamaterial at 780 nm Wavelength", Optics Letters, vol. 32, No. 1, Jan. 1, 2007, pp. 53-55.

Mao, Weidong et al., "Crystallography of Two-Dimensional Photonic Lattices Formed by Holography of Three Noncoplanar Beams", Optical Society of America, vol. 22, No. 5, May 2005, pp. 1085-1091.

Moon, Jun Hyuk et al., "Photonic Band-Gap Structures of Core-Shell Simple Cubic Crystals from Holographic Lithography", Applied Physics Letter, vol. 88, 2006, pp. 121101-1-121101-3; 1 pg. Copyright Notice.

Pang, Lin et al., "Fabrication of Two-Dimensional Photonic Crystals with Controlled Defects by Use of Multiple Exposures and Direct Write", Applied Optics, vol. 42, No. 27, Sep. 20, 2003, pp. 5450-5456.

Zhang, Shuang et al., "Near-Infrared Double Negative Metamaterials", Optics Express, vol. 13, No. 13, Jun. 27, 2005, pp. 4922-4930; 1 pg. Copyright Notice.

Caloz, Christophe et al., "Metamaterials for High-Frequency Electronics", Proceedings of the IEEE, vol. 93, No. 10, Oct. 2005, pp. 1744-1752.

Dolling, Gunnar et al., "Simultaneous Negative Phase and Group Velocity of Light in a Metamaterial", Science, vol. 312, May 12, 2006, pp. 892-894.

Klar, Thomas A. et al., "Negative-Index Metamaterials: Going Optical", pp. 1-11.

Knickerbocker, John U. et al., "3-D Silicon Integration and Silicon Packaging Technology Using Silicon Through-Vias", IEEE Journal of Solid-State Circuits, vol. 41, No. 8, Aug. 2006, pp. 1718-1725.

Liu, Zhaowei et al., "Far-Field Optical Hyperlens Magnifying Sub-Diffraction-Limited Objects", Science, vol. 315, Mar. 23, 2007, p. 1686.

Ramakrishna, S. Anantha, "Physics of Negative Refractive Index Materials", Institute of Physics Publishing, vol. 68, 2005, pp. 449-521.

Smolyaninov, Igor I. et al., "Magnifying Superlens in the Visible Frequency Range", Science, vol. 315, Mar. 23, 2007, pp. 1699-1701.

* cited by examiner

PHOTO-MASKS AND METHODS OF FABRICATING PERIODIC OPTICAL STRUCTURES

CROSS-REFERENCE TO RELATED APPLICATION

The present application is a continuation-in-part of, and claims priority to, U.S. patent application Ser. No. 11/871, 834, filed 12 Oct. 2007, and entitled "Photo-Masks and Methods of Fabricating Photonic Crystal Devices," and also claims the benefit of U.S. Provisional Patent Application Ser. No. 60/883,557, filed 5 Jan. 2007, and entitled "Photo-Masks for Metamaterials," the contents of which are hereby incorporated by reference in their entireties as if fully set forth below.

TECHNICAL FIELD

The various embodiments of the present invention relate generally to periodic optical structures, and more particularly, to photo-masks for use in fabricating periodic optical structures, and to methods of making the photo-masks and periodic optical structures.

BACKGROUND

Periodic optical structures, such as photonic crystals, metamaterials, and the like, play an important role in optoelectronic devices. Periodic optical structures are designed to affect the motion of photons using the physical phenomenon of diffraction. This is similar to the way that periodicity in a semiconductor crystal affects the motion of electrons. Specifically, periodic optical structures are made from periodic dielectric or metallo-dielectric structures that are designed to affect the propagation of electromagnetic waves in the same way as the periodic potential in a semiconductor crystal affects the electron motion by defining allowed and forbidden electronic energy bands. For example, the absence of allowed propagating electromagnetic modes inside the photonic crystal structures, in a range of wavelengths called a photonic band gap, gives rise to distinct optical phenomena such as inhibition of spontaneous emission, high-reflecting omni-directional mirrors, and low-loss or lossless waveguiding, among others. In addition to some of the optical phenomena observed for photonic crystal devices, metamaterials that have negative refractive indices exhibit properties that include a Doppler effect reversal (i.e., a light source will appear to reduce, instead of increase, its frequency as it moves towards you) and a Snell's law reversal (i.e., light rays will refract on the same side of the normal vector upon entering the material), among others.

Owing to this ability to control and manipulate the flow of light, periodic optical structures find use in many applications. For example, two-dimensional photonic crystals, in the form of thin-films, are found in low- and high-reflection coatings on lenses and mirrors as well as in color-changing paints and inks; and metamaterials have been used to produce superlenses, or lenses that exceed the diffraction limit. In addition, based on the potential to offer lossless control of light propagation at a size scale near the order of the wavelength of light for photonic crystal devices, and at a size scale smaller than the wavelength of light for metamaterials, periodic optical structures have the potential to produce the first truly dense integrated photonic circuits and systems (DIPCS). Individual components that are actively being developed include resonators, antennas, sensors, multiplexers, filters, couplers, switches, superlenses, frequency-doubling devices, parametric amplifiers, parametric oscillators, and the like. The integration of these components would produce DIPCS that would perform functions such as image acquisition, target recognition, image processing, optical interconnections, Analog-to-Digital conversion, sensing, and the like. Further, the resulting DIPCS would be very compact in size and highly field-portable.

Since the basic physical phenomenon is based on diffraction, the periodicity of the periodic optical structure has to be in the same or smaller length-scale as approximately half the wavelength of the electromagnetic waves. For example, applications using light at telecommunications wavelengths require structures to be fabricated at microscale and nanoscale dimensions. This, however, is the major challenge to commercial implementation of periodic optical structure-based devices. More specifically, there is currently a lack of systematic fabrication procedures for reliable and reproducible production of microscale and nanoscale periodic optical structures with sufficient precision to prevent scattering losses blurring the optical properties.

Most techniques for fabricating 2- and 3-dimensional periodic optical structures are based on those used for integrated circuits, such as photolithography and etching techniques. However, these methods are not optimal. To circumvent these methods, which require complex machinery, alternative approaches have been proposed. These include, for example, self-assembling photonic crystal structures from colloids or using fiber drawing techniques developed for communications fiber to grow photonic crystal-fibers. However, these methods do not lend themselves well to reliable and reproducible commercial scale production.

Accordingly, there remains a need for improved methods of producing periodic optical structures or devices. It is to the provision of such methods that the various embodiments of the present invention are directed. More specifically, it is to the provision of improved photo-masks for use in fabricating periodic optical structures, as well as the associated periodic optical structures fabricated therefrom, that the various embodiments of the present invention are directed.

BRIEF SUMMARY

Various embodiments of the present invention are directed to photo-masks for use in fabricating 1-, 2-, or 3-dimensional periodic optical structures (e.g., photonic crystal structures or devices, metamaterials, or the like). Some embodiments are also directed to methods of fabricating such structures. Still some other embodiments are directed to the fabricated structures themselves.

Broadly described, a photo-mask according to an embodiment of the present invention can include a body element and a set of diffractive elements and/or refractive elements disposed on the body element and/or within the body element. The set of diffractive elements and/or refractive elements can be configured to produce three or four non-coplanar beams of light when a beam of light is passed through it. The photo-mask can include additional sets of diffractive elements and/or refractive elements disposed on the body element and/or within the body element. Each additional set of diffractive elements and/or refractive elements is also configured to produce three or four additional non-coplanar beams of light when a beam of light is passed through it.

Each set of diffractive elements and/or refractive elements generally includes two or more diffractive elements and/or refractive elements. According to one embodiment, each set of diffractive elements and/or refractive elements comprises three diffractive elements and/or refractive elements. According to another embodiment, each set of diffractive elements and/or refractive elements comprises four diffractive elements and/or refractive elements. The diffractive elements can include volume gratings or surface-relief gratings; and the refractive elements can include materials having a different index of refraction than the body element.

In addition, the photo-mask can further include a chrome layer, an absorption layer, a retarder layer, or more than one of the foregoing layers.

An apparatus for producing a periodic optical structure according to an embodiment of the present invention can include a photo-mask and a recording material, which can be a photosensitive recording material. Each set of diffractive elements and/or refractive elements of the photo-mask is configured to individually produce three or four non-coplanar beams of light when a beam of light is passed therethrough such that each set of three or four non-coplanar beams of light interferometrically produce a separate periodic optical structure at a specific location in the recording material.

A method of fabricating a periodic optical structure according to an embodiment of the present invention can include generating a light beam that can be directed into a photo-mask. Each set of diffractive elements and/or refractive elements in the photo-mask produces three or four non-coplanar beams of light. Each set of three or four non-coplanar beams of light can be focused in a recording material to interferometrically produce a separate periodic optical structure in the recording material.

If simultaneous production of multiple periodic optical structures in the recording material is not desired, the methods can be repeated to produce multiple periodic optical structures in the recording material by aligning the photo-mask over a second portion of the recording material and repeating the methods on the second portion of the recording material.

Other aspects and features of embodiments of the present invention will become apparent to those of ordinary skill in the art, upon reviewing the following detailed description in conjunction with the accompanying figures.

BRIEF DESCRIPTION OF THE DRAWINGS

The various embodiments of the invention can be better understood with reference to the following drawings. The components in the drawings are not necessarily to scale, emphasis instead being placed upon clearly illustrating the principles of the various embodiments of the present invention. In the drawings, like reference numerals designate corresponding parts throughout the several views.

DETAILED DESCRIPTION

Figure 1A:
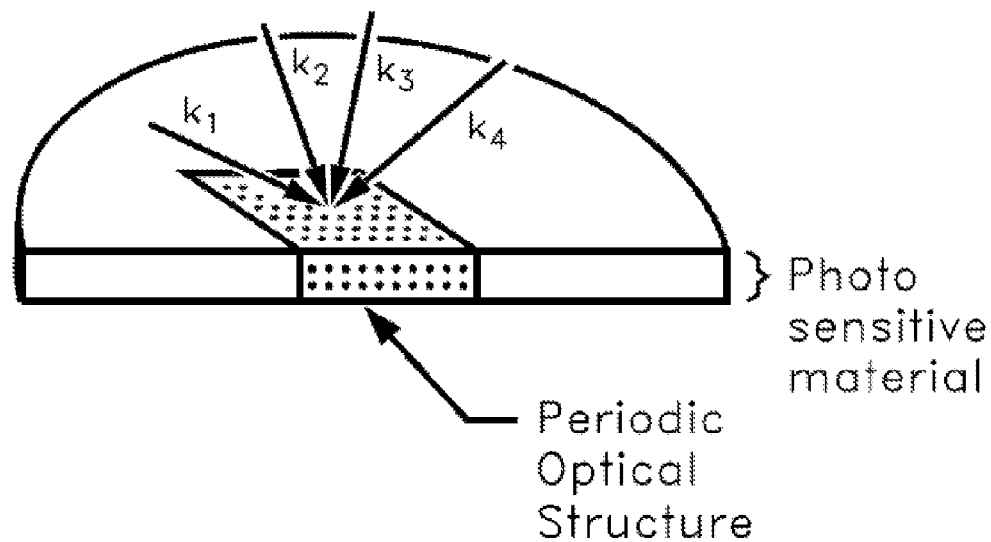
FIG. 1 schematically illustrates the formation of a periodic optical structure produced by the interference of (a) four or (b) three non-coplanar wave vectors according to some embodiments of the present invention.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented. The terms "first," "second," and the like, "primary," "secondary," and the like, do not denote any order, quantity, or importance, but rather are used to distinguish one element from another. Further, the terms "a", "an", and "the" do not denote a limitation of quantity, but rather denote the presence of "at least one" of the referenced item.

Multi-beam interference lithography allows for the production of a multitude of interference patterns that can be generated in two and three dimensions. When two or more optical waves are simultaneously present in the same region of space, the waves interfere and generate periodic variations in intensity and polarization. Interference among any n, where n is less than or equal to 4, non-coplanar beams produces an intensity grating with (n−1) dimensional periodicity, if the difference between their wave vectors is non-coplanar. If the interference pattern is transferred into a photosensitive recording material, such as a photoresist film, then periodic lithographic structures corresponding to the interference pattern can be recorded into the photosensitive material.

All 2- and 3-dimensional Bravais lattices, as well as eight of the seventeen plane group symmetries, can be produced via the interference of three or four non-coplanar beams of light. For example, all fourteen 3-dimensional Bravais lattices can be produced by interferometric exposure of four coherent non-coplanar beams. To illustrate this capability, for a general triclinic crystal lattice (with lattice vector lengths a, b, c with opposite-side angles of $\alpha$, $\beta$, $\delta$), the wave vectors of the four non-coplanar waves are calculated to be as follows:

$$k_1 = k(l_1, m_1, n_1) \tag{1}$$

$$k_2 = k\left(l_1 - \frac{\lambda}{\alpha}, m_1 + \frac{\lambda \cos\gamma}{a \sin\gamma}, n_1 + \frac{\lambda(\cos\beta - \cos\alpha\cos\gamma)}{a\delta\sin^2\gamma}\right) \tag{2}$$

$$k_3 = k\left(l_1, m_1 - \frac{\lambda}{b\sin\gamma}, n_1 + \frac{\lambda(\cos\alpha - \cos\beta\cos\gamma)}{b\delta\sin^2\gamma}\right) \tag{3}$$

$$k_4 = k\left(l_1, m_1, n_1 - \frac{\lambda}{c\delta}\right) \tag{4}$$

where the direction cosines $l_1$, $m_1$, and $n_1$ are given by $$l_1 = \frac{\lambda(bc\sin^2\alpha + ac\cos\gamma\sin^2\beta + ab\cos\beta\sin^2\gamma)}{2abc\delta^2\sin^2\gamma} \tag{5}$$

$$m_1 = \frac{\lambda[b(\cos\alpha - \cos\beta\cos\gamma) + c\sin^2\beta]}{2bc\delta^2\sin\gamma} \tag{6}$$

$$n_1 = \frac{\lambda}{2c\delta} \tag{7}$$

and the wavelength $\lambda$ must be chosen such that $$\lambda = 2abc\delta^2[a^2b^2 + b^2c^2\sin^4\alpha\csc^4\gamma + a^2c^2\sin^4\beta\csc^4\gamma + 2abc\csc^2\gamma(\alpha\cos\alpha\sin^2\beta + b\cos\beta\sin^2\alpha + \cos\gamma\sin^2\alpha\sin^2\beta\csc^2\gamma)]^{-1/2}. \tag{8}$$

This general set of expressions reduces to relationships for the fourteen Bravais lattices in the appropriate limits. Thus, the triclinic structure can transform to monoclinic, orthorhombic, tetragonal, rhombohedral (trigonal), hexagonal, body-centered orthorhombic, body-centered tetragonal, body-centered monoclinic, body-centered cubic, face-centered orthorhombic, face-centered cubic, base-centered monoclinic, or base-centered orthorhombic lattices. Accordingly, all fourteen Bravais lattices can be realized with the wave vectors given by Equations (1) through (8). These specified four non-coplanar wave vectors, which, upon interference, can be used to produce any Bravais lattice, are depicted schematically in FIG. 1(a) as $k_1$, $k_2$, $k_3$, and $k_4$. Because any of the 14 Bravais lattices can be produced, any crystallographic (and more specifically, any periodic optical crystal) structure can also be produced in, for example, a photosensitive material.

Figure 1B:
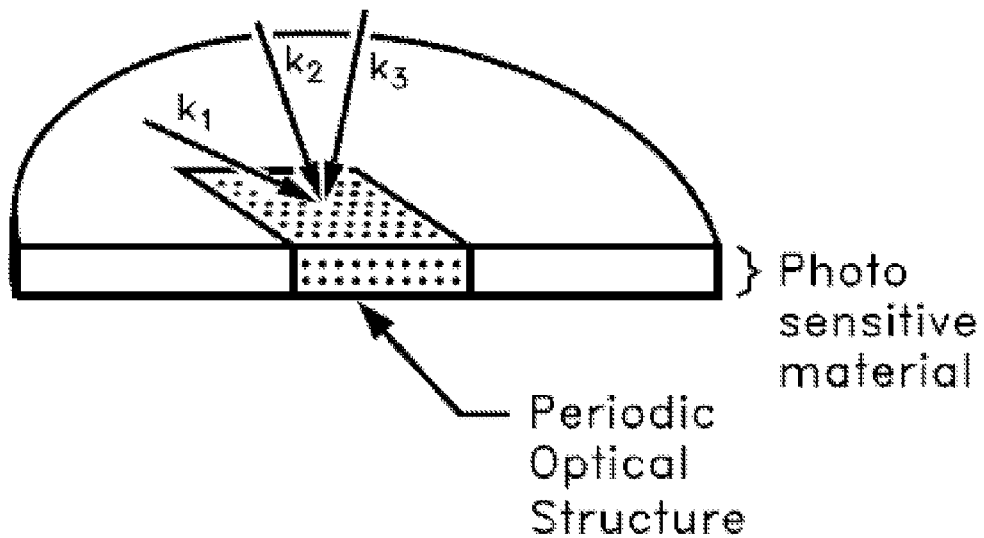

Similarly, with three non-coplanar beams, the wave vectors and wavelength are also obtained using Equations (1) through (8) above, but with $\alpha=90$ degrees, $\beta=90$ degrees, and c approaching $\infty$ (infinity). Under these circumstances, $k_1$ and $k_4$ collapse into a single degenerate wave vector. Thus, there are three unique wave vectors, $k_1$, $k_2$ and $k_3$ for a three-beam case, as shown in FIG. 1(b). It should be noted that only five of the seventeen plane symmetry groups can be produced by interferometric exposure of three coherent linearly polarized non-coplanar beams. These plane groups are p2, pmm, cmm, p4m, and p6m. Three more of the seventeen plane symmetry groups can be produced with three elliptically polarized non-coplanar beams. These additional three plane groups are p1, cm, and p3m1. By using the retarder layer in the photo-mask, as described below, linearly polarized incident light can be converted to elliptically polarized transmitted light. Thus periodic optical structures with the symmetry of these three additional plane groups can also be produced by the inventive mask.

Equations (1) through (8) above can be used for both three and four beam embodiments. The format of Equations (1) through (8) has been chosen for compact presentation with the wavelength being conceptually calculated after the periodic structure is specified. In common practice, however, a designer of a periodic optical structure will start with the wavelength, the ratios of the lattice vectors, and the angles, and then will calculate the wave vectors from these. Regardless, the same set of equations is valid in either case.

Figure 2:
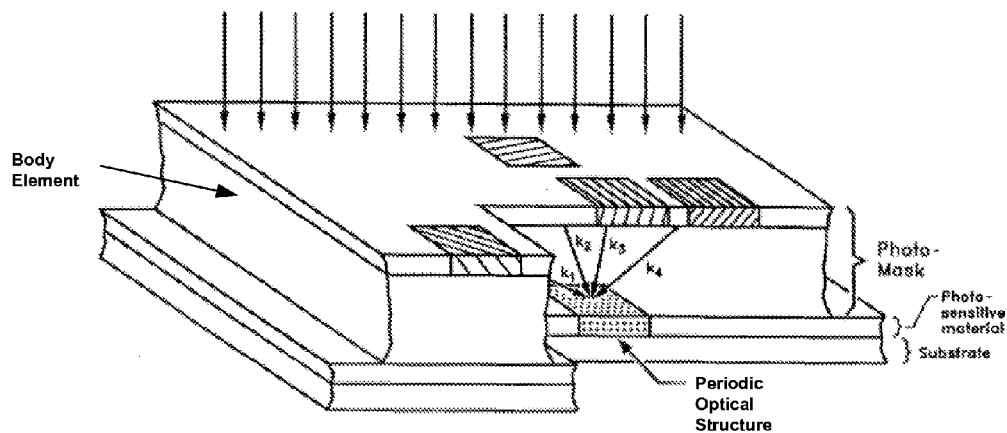
FIG. 2 schematically illustrates a photo-mask according to some embodiments of the present invention.

The photo-masks disclosed herein provide a means for using multi-beam interference lithography to produce periodic optical structures with a single collimated exposure beam rather than using three or four non-coplanar beams that need to be individually, accurately aligned. A portion of an exemplary photo-mask is shown in FIG. 2. As stated above, the photo-masks generally include a body element and a set of diffractive elements and/or refractive elements that are disposed on the body element and/or within the body element. It is the set of diffractive elements and/or refractive elements that allow the inventive photo-masks to create the necessary number of beams to produce a periodic optical structure at a specific location within a photosensitive recording material.

The photo-masks can be produced by creating a plurality of diffractive elements and/or refractive elements in or on the body element or substrate. In exemplary embodiments, the refractive elements are contained within the body element, while the diffractive elements are contained in a layer disposed on the body element. It is important to note that a combination of diffractive elements and refractive elements can be used to produce a single set of elements. That is, each set of elements is not limited to having only diffractive elements or only refractive elements. It should also be noted that if a photo-mask has multiple sets of diffractive elements and/or refractive elements, all of the sets do not have to be identical to each other.

The methods disclosed in commonly-assigned U.S. Pat. Nos. 6,285,813 and 6,606,432 can be used to produce diffractive elements, such as volume gratings, in the photo-mask. For example, one method in U.S. Pat. No. 6,285,813 teaches splitting a coherent light beam into a first coherent light beam and a second light beam. The first coherent light beam is directed into a first lens and onto an optical component, such as a prism. The second coherent light beam is directed into a second lens and onto the optical component. The optical component optically transmits the first and second coherent light beams into a recording material to create a diffractive grating. Further, U.S. Pat. No. 6,606,432 provides a method for producing multiple diffraction gratings in a single recording material, which can serve as a phase mask.

In contrast, to produce refractive elements in the photo-mask, additional components having different indices of refraction from the primary component of the photo-mask (e.g., air, polymers, glass, and the like) can be incorporated into various regions of the photo-mask. These refractive elements can be used to alter the direction of the light exiting the photo-mask.

As described, the photo-mask can include many sets of diffractive elements and/or refractive elements, each set producing the three or four non-coplanar beams, and each set fabricating a specific periodic optical structure at a specified location in the photosensitive recording material. Thus, the inventive photo-masks can be directly used for wafer-scale fabrication of multitudes of periodic optical structures or devices in a single exposure. In some embodiments, the photo-masks can be used in a mask aligner.

Each set of elements used to generate the three or four non-coplanar beams can include two or more diffractive elements and/or refractive elements. In certain embodiments where only two elements are used, the body element itself can be used to produce a third non-coplanar beam. Each refractive element or diffractive element within a single set of elements preferably diffracts or refracts the exposure beam in such a way that the diffracted or refracted light beam produced by that particular element is not coplanar to another beam produced by another refractive element or diffractive element within the same single set.

In exemplary embodiments, each set of elements comprises three or four diffractive elements and/or refractive elements. In this manner, each element of the set produces one non-coplanar beam of light. Further, in these embodiments (i.e., those where the number of diffractive elements and/or refractive elements within each set of elements is equal to the number of desired non-coplanar beams), the body element itself does not transmit the incident light through the photo-mask to the recording material. The incident light can be prevented from being transmitted to the recording material by choosing the composition of the body element such that it is opaque to the wavelength of the incident light; or the photo-mask can optionally have a layer of a non-transparent material (e.g., a chrome layer) disposed thereon that prevents the incident light from being transmitted to the recording material.

The photo-mask optionally can incorporate a chrome pattern layer on the side adjacent to the recording material. The chrome layer can then delineate regions where the periodic optical structure will be fabricated on the recording material. Specifically, only the angularly deviated light that passes through the transparent portions of the chrome layer can be exposed to the recording material.

The polarization of the beams can be chosen to produce controlled pattern contrast. Such methods for selecting the polarization to control the contrast are known to those skilled in the art to which this disclosure pertains. The inventive photo-masks extend this concept in that the present photo-masks can include a retarder layer (equivalent to a half-wave plate) to rotate the input linear polarization at each diffractive element site. This would be done to optimize the polarization for recording when needed or desired. In addition, the retarder layer can be used to convert linearly polarized incident light to elliptically polarized transmitted light as may be desired.

If the intensity of a beam is too large, the excess power can be attenuated by introducing an absorption layer at the site of each diffractive element.

Figure 3:
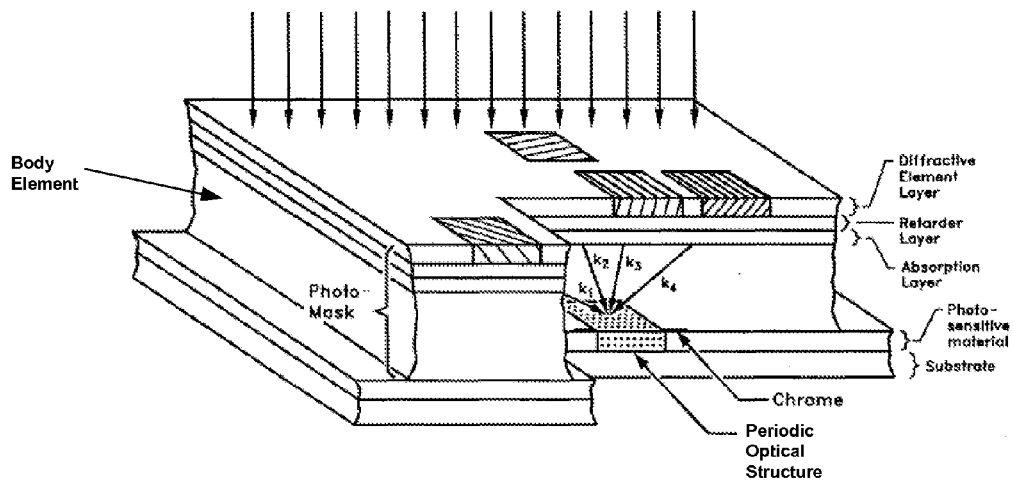
FIG. 3 schematically illustrates a photo-mask according to other embodiments of the present invention.

Another exemplary photo-mask is shown in FIG. 3. This photo-mask includes a retarder layer and an absorption layer at selected diffractive element sites, and also shows a chrome layer at selected sites of the photosensitive recording material.

The resulting photo-masks described above provide new methods for producing the three or four beams needed for multi-beam interference lithography using only one light beam. While more than one light source can be used, the need for more than one is rendered moot by the presence of the set of diffractive elements and/or refractive elements that can produce the non-coplanar beams from the one beam. The resulting masks are also simple to use with existing photolithography masking technologies, and can be subsequently repetitively used many times.

Figure 4:
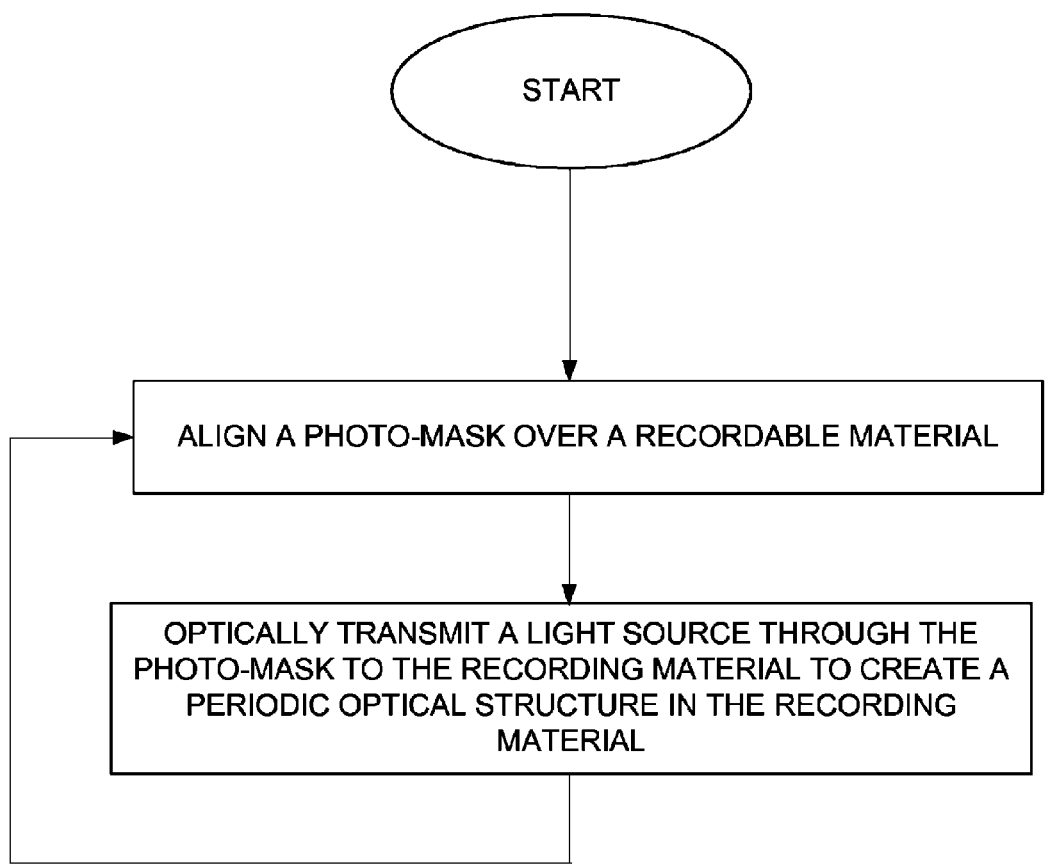
FIG. 4 is a process flow diagram illustrating an exemplary implementation of a method for making periodic optical structures using a photo-mask.

FIG. 4 provides a flow diagram illustrating an exemplary implementation of a method for making one or more periodic optical structures using a photo-mask. To create the periodic optical structures, the photo-mask is aligned over the recording material on which the periodic optical structures are to be created. Once the photo-mask is aligned over the recording material, light produced by a light source is directed or optically transmitted through the photo mask to the recording material to create the periodic optical structures in the recording material. Using this method, a plurality of periodic optical structures may be created, in a practical manufacturing-oriented manner, substantially simultaneously (e.g., in parallel) over an entire recording material, such as a wafer.

Various periodic optical structures can be fabricated using the photo-masks and methods described herein. These include, but are not limited to, photonic crystal devices, metamaterials, and the like. The photo-masks, light source, recording materials, and methods would need to be varied in order to produce the different types of materials, and these variations would be known to those skilled in the art to which this disclosure pertains.

By way of example, with reference to a photonic crystal device, which generally has wavelength-sized features, the light source could be a visible or near-ultraviolet light source. The substrate or body element of the photo-mask can generally be formed from a glass, photosensitive material, or any other material suitable for use in a photo-mask. The glass can be a fused silica, borosilicate crown glass (e.g., BK-7), or other similar glass. The photosensitive material can be any photorefractive crystal, organic volume phase holographic material, silicon-based polymer, or like material. The period of the refractive elements or diffractive elements of the photo-mask could generally be on the order of micrometers in order to produce a photonic crystal structure having micrometer- or nanometer-scale features. Finally, the recording materials are generally photosensitive compositions (such as those listed immediately above). The resulting photonic crystal devices could be 1-, 2-, or 3-dimensional devices.

In contrast, to produce a metamaterial, which generally has subwavelength-sized features, different conditions would be needed. For example, the light source could be a deep-ultraviolet light source. While the substrate or body element of the photo-mask could be formed from a glass or other dielectric, the material should be transparent to the light of the light source. Calcite is an exemplary material that is transparent to deep-ultraviolet light. The period of the refractive elements or diffractive elements of the photo-mask would generally be scaled down relative to those needed for a photonic crystal device. Specifically, the periods of the refractive elements or diffractive elements could be about 1 nanometer to about 100 nanometers in order to produce a metamaterials having low nanometer-scale features. Such small periods of the refractive elements or diffractive elements could be prepared by electron beam lithography, deep-ultraviolet lithography, or a similar technique used for integrated circuits. Finally, the recording materials could a metal-dielectric-metal material multilayered structure, such that the dielectric layer is a dielectric oxide, glass, photosensitive composition (such as those listed above), or the like, and the metal could be gold, silver, or other metal with a negative permittivity. The resulting metamaterials could be 2-dimensional structures.

The embodiments of the present invention are not limited to the particular formulations, process steps, and materials disclosed herein as such formulations, process steps, and materials may vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, temperature and pressure parameters may vary depending on the particular materials used.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above discussed embodiments, and should only be defined by the following claims and all equivalents.

What is claimed is:

1. A photo-mask for producing a periodic structure, comprising:
    a body element; and
    a set of diffractive elements and/or refractive elements disposed on the body element and/or within the body element, wherein each diffractive element and/or refractive element in the set of diffractive elements and/or refractive elements produces only one non-coplanar beam of light;
    wherein the set of diffractive elements and/or refractive elements is configured to produce three or four non-coplanar beams of light when a beam of light is passed therethrough.

2. The photo-mask of claim 1, wherein the photo-mask further comprises a chrome layer.

3. The photo-mask of claim 1, wherein the photo-mask further comprises an absorption layer.

4. The photo-mask of claim 1, wherein the photo-mask further comprises a retarder layer.

5. The photo-mask of claim 1, wherein the diffractive elements comprise one or more volume gratings or surface-relief gratings.

6. The photo-mask of claim 1, wherein the refractive elements comprise one or more materials having a different index of refraction than the body element.

7. The photo-mask of claim 1, wherein the set of diffractive elements and/or refractive elements comprises two or more diffractive elements and/or refractive elements.

8. The photo-mask of claim 1, wherein the set of diffractive elements and/or refractive elements comprises three or four diffractive elements and/or refractive elements.

9. The photo-mask of claim 1, further comprising one or more additional sets of diffractive elements and/or refractive elements disposed on the body element and/or within the body element, wherein each additional set of diffractive elements and/or refractive elements is configured to produce three or four additional non-coplanar beams of light when the beam of light is passed therethrough.

10. An apparatus for producing a periodic optical structure, the apparatus comprising:
    a photo-mask comprising a set of diffractive elements and/or refractive elements disposed on a body element and/or within the body element, wherein each diffractive element and/or refractive element in the set of diffractive elements and/or refractive elements produces only one non-coplanar beam of light; and
    a recording material;
    wherein the set of diffractive elements and/or refractive elements is configured to produce three or four non-coplanar beams of light when a beam of light is passed therethrough such that the three or four non-coplanar beams of light interferometrically produce a periodic optical structure at a specific location in the recording material.

11. The apparatus of claim 10, wherein the photo-mask further comprises one or more of a chrome layer, absorption layer, or retarder layer.

12. The apparatus of claim 10, wherein the diffractive elements comprise volume gratings or surface-relief gratings.

13. The apparatus of claim 10, wherein the refractive elements comprise materials having a different index of refraction than the body element.

14. The apparatus of claim 10, wherein the set of diffractive elements and/or refractive elements comprises two or more diffractive elements and/or refractive elements.

15. The apparatus of claim 10, wherein the set of diffractive elements and/or refractive elements comprises three or four diffractive elements and/or refractive elements.

16. The apparatus of claim 10, wherein the photo-mask further comprises one or more additional sets of diffractive elements and/or refractive elements disposed on the body element and/or within the body element, wherein each additional set of diffractive elements and/or refractive elements is configured to produce three or four additional non-coplanar beams of light when the beam of light is passed therethrough.

17. A method of fabricating a periodic optical structure, the method comprising:
    generating a light beam;
    directing the light beam into a photo-mask having a set of diffractive elements and/or refractive elements to produce three or four non-coplanar beams of light, wherein each diffractive element and/or refractive element in the set of diffractive elements and/or refractive elements produces only one non-coplanar beam of light; and
    focusing the three or four non-coplanar beams of light in a photosensitive recording material to interferometrically produce a periodic optical structure in the photosensitive recording material.

18. The method of claim 17, further comprising:
    aligning the photo-mask over a second portion of the recording material; and
    repeating the generating, directing, and focusing on the second portion of the recording material.

19. The method of claim 17, wherein the photo-mask further comprises one or more of a chrome layer, absorption layer, or retarder layer.

20. The method of claim 17, wherein the photo-mask further comprises one or more additional sets of diffractive elements and/or refractive elements, wherein directing the light beam into the photo-mask produces three or four additional non-coplanar beams of light for each additional set of diffractive elements and/or refractive elements, and each set of three or four non-coplanar beams is focused in the photosensitive recording material to interferometrically produce additional periodic optical structures in the photosensitive recording material.

* * * * *